US012690354B2

(12) United States Patent
Lim

(10) Patent No.: US 12,690,354 B2
(45) Date of Patent: Jul. 21, 2026

(54) DISPLAY APPARATUS HAVING IMPROVED LIGHT EMITTING EFFICIENCY

(71) Applicant: LG DISPLAY CO., LTD., Seoul (KR)

(72) Inventor: Hyeong-Jun Lim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 641 days.

(21) Appl. No.: 18/088,525

(22) Filed: Dec. 24, 2022

(65) Prior Publication Data

US 2023/0217773 A1 Jul. 6, 2023

(30) Foreign Application Priority Data

Dec. 31, 2021 (KR) ........................ 10-2021-0194656

(51) Int. Cl.
| | |
|---|---|
| *H10K 59/38* | (2023.01) |
| *H10K 59/12* | (2023.01) |
| *H10K 59/80* | (2023.01) |
| *H10K 71/00* | (2023.01) |

(52) U.S. Cl.
CPC ........... *H10K 59/38* (2023.02); *H10K 59/873* (2023.02); *H10K 59/879* (2023.02); *H10K 71/00* (2023.02); *H10K 59/12* (2023.02); *H10K 59/1201* (2023.02)

(58) Field of Classification Search
CPC .... H10K 59/38; H10K 59/873; H10K 59/879; H10K 71/00; H10K 59/12; H10K 59/1201; H10K 2102/3026; H10K 59/35; H10K 50/8445; H10K 50/856; H10K 50/858; H10K 59/122
See application file for complete search history.

(56) References Cited

U.S. PATENT DOCUMENTS

| | | | | |
|---|---|---|---|---|
| 9,303,153 | B2 * | 4/2016 | Nick .................... | C09K 11/703 |
| 9,331,285 | B2 * | 5/2016 | Mizuki ................. | H10K 85/40 |
| 9,365,701 | B2 * | 6/2016 | Nick ........................ | C09D 5/22 |
| 9,534,313 | B2 * | 1/2017 | Linton .................... | C30B 7/08 |
| 9,711,665 | B2 * | 7/2017 | Wagenblast ........... | H10F 19/80 |
| 9,874,674 | B2 * | 1/2018 | Coe-Sullivan ....... | G02B 6/0043 |
| 9,902,687 | B2 * | 2/2018 | Ito ......................... | H10K 85/654 |
| 9,929,325 | B2 * | 3/2018 | Mahan ................. | G02B 6/0003 |
| 9,951,438 | B2 * | 4/2018 | Breen .................... | C30B 29/48 |
| 10,247,985 | B2 * | 4/2019 | Qi ..................... | G02F 1/133606 |
| 10,263,191 | B2 * | 4/2019 | Mizuki ................. | H05B 33/20 |
| 11,367,850 | B2 * | 6/2022 | Kim .................... | H10K 50/131 |

(Continued)

FOREIGN PATENT DOCUMENTS

| | | |
|---|---|---|
| KR | 20140083143 A | 7/2014 |
| KR | 10-2014-0135568 A | 11/2014 |

(Continued)

OTHER PUBLICATIONS

Office Action in Korean Appln. No. 10-2021-0194656, mailed on Jan. 8, 2025, 24 pages (with English translation).

*Primary Examiner* — Caleb E Henry

(74) *Attorney, Agent, or Firm* — Fish & Richardson P.C.

(57) ABSTRACT

A display apparatus includes: a substrate including a plurality of sub-pixels; an organic light emitting element formed in each of the plurality of sub-pixels; a light control member including a light control pattern disposed in each of the plurality of sub-pixels, and an air layer between adjacent light control patterns; and a color filter layer disposed on the light control member.

18 Claims, 13 Drawing Sheets

(56) References Cited

U.S. PATENT DOCUMENTS

| | | | | |
|---|---|---|---|---|
| 11,637,157 B2* | 4/2023 | Choi | H10K 59/352 | |
| | | | 257/40 | |
| 2007/0090755 A1* | 4/2007 | Eida | B82Y 20/00 | |
| | | | 313/506 | |
| 2015/0001486 A1* | 1/2015 | Kim | H10K 59/122 | |
| | | | 438/23 | |
| 2017/0110522 A1* | 4/2017 | Lee | H10K 50/856 | |
| 2017/0125740 A1* | 5/2017 | Lee | H10K 59/80515 | |
| 2019/0148460 A1* | 5/2019 | Kim | H10K 59/879 | |
| | | | 257/40 | |
| 2019/0172874 A1* | 6/2019 | Lim | H10K 59/879 | |
| 2019/0181202 A1* | 6/2019 | Lim | H10K 50/19 | |
| 2019/0189701 A1* | 6/2019 | Bang | H10K 59/122 | |
| 2019/0312228 A1* | 10/2019 | Sonoda | H10K 59/8722 | |
| 2019/0371872 A1* | 12/2019 | Nendai | H10K 59/80515 | |
| 2020/0006438 A1* | 1/2020 | Gong | H10K 59/122 | |
| 2020/0185638 A1* | 6/2020 | Choi | H10K 59/38 | |
| 2020/0212128 A1* | 7/2020 | Son | H10K 59/353 | |
| 2021/0043690 A1* | 2/2021 | Sim | H10K 59/38 | |
| 2021/0202606 A1* | 7/2021 | Kim | H10K 59/353 | |
| 2021/0202653 A1* | 7/2021 | Cho | H10K 71/00 | |
| 2021/0217835 A1* | 7/2021 | Park | H10K 50/844 | |
| 2021/0234134 A1* | 7/2021 | Qi | H10K 59/8731 | |
| 2021/0249478 A1* | 8/2021 | Oh | H10K 59/38 | |
| 2021/0273022 A1* | 9/2021 | Park | G02B 5/26 | |
| 2021/0280750 A1* | 9/2021 | Park | H10H 20/8513 | |
| 2022/0029131 A1* | 1/2022 | Jeong | G06F 3/0412 | |
| 2022/0208867 A1* | 6/2022 | Heo | H10K 59/131 | |
| 2022/0209198 A1* | 6/2022 | Kim | H10K 59/878 | |
| 2022/0367829 A1* | 11/2022 | Lee | H10K 59/122 | |

FOREIGN PATENT DOCUMENTS

| | | |
|---|---|---|
| KR | 20190087689 A | 7/2019 |
| KR | 10-2019-0097914 A | 8/2019 |
| KR | 20200002342 A | 1/2020 |
| KR | 20200083875 A | 7/2020 |
| KR | 20200097373 A | 8/2020 |

* cited by examiner

DISPLAY APPARATUS HAVING IMPROVED LIGHT EMITTING EFFICIENCY

CROSS REFERENCE TO RELATED APPLICATION

The present application claims the priority benefit of Korean Patent Application No. 10-2021-0194656 filed in Republic of Korea on Dec. 31, 2021, which is hereby incorporated by reference in its entirety for all purposes as if fully set forth herein.

BACKGROUND

Technical Field

The present disclosure relates to a high-resolution display apparatus with an improved light efficiency.

Discussion of the Related Art

Recently, with a development of multimedia, importance of a flat display apparatus has been increased. In response to this, flat display apparatuses, such as a liquid crystal display, a plasma display, and an organic electroluminescent display, have been commercialized. Among these flat display apparatuses, the organic electroluminescent display has a high response speed, a high luminance and a good viewing angle.

Meanwhile, as virtual reality and augmented reality attract a lot of attention in recent years, a demand for a compact virtual reality and augmented reality devices with a high resolution is increasing. However, it is difficult to satisfy such high resolution and compactness with the organic electroluminescent display.

SUMMARY

Accordingly, aspects of the present disclosure are directed to a display apparatus that addresses one or more of the problems due to limitations and disadvantages of the related art.

Aspects of the disclosure provide a display apparatus which can prevent defects due to color mixing with an adjacent sub-pixel and improving light efficiency.

Additional features and advantages of the disclosure will be set forth in the description which follows, and in part will be apparent from the description, or may be learned by practice of the disclosure. These and other advantages of the disclosure will be realized and attained by the structure particularly pointed out in the written description and claims hereof as well as the appended drawings.

To achieve these and other advantages and in accordance with the purpose of the present disclosure, as embodied and broadly described herein, a display apparatus includes: a substrate including a plurality of sub-pixels; an organic light emitting element formed in each of the plurality of sub-pixels; a light control member including a light control pattern disposed in each of the plurality of sub-pixels, and an air layer between adjacent light control patterns; and a color filter layer disposed on the light control member.

In another aspect, a display apparatus includes: a substrate including a plurality of sub-pixels; an organic light emitting element formed in each of the plurality of sub-pixels; an encapsulation layer disposed on the organic light emitting element; and a color filter layer disposed on the encapsulation layer, wherein the encapsulation layer includes a first encapsulation layer formed entirely over the substrate, a second encapsulation layer formed in a pyramid or lens shape on the first encapsulation layer, and a third encapsulation layer disposed on the second encapsulation layer, and wherein an air layer is formed between adjacent second encapsulation layers such that a light emitted from the organic light emitting element is reflected at an interface between the second encapsulation layer and the air layer.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Figure 1:
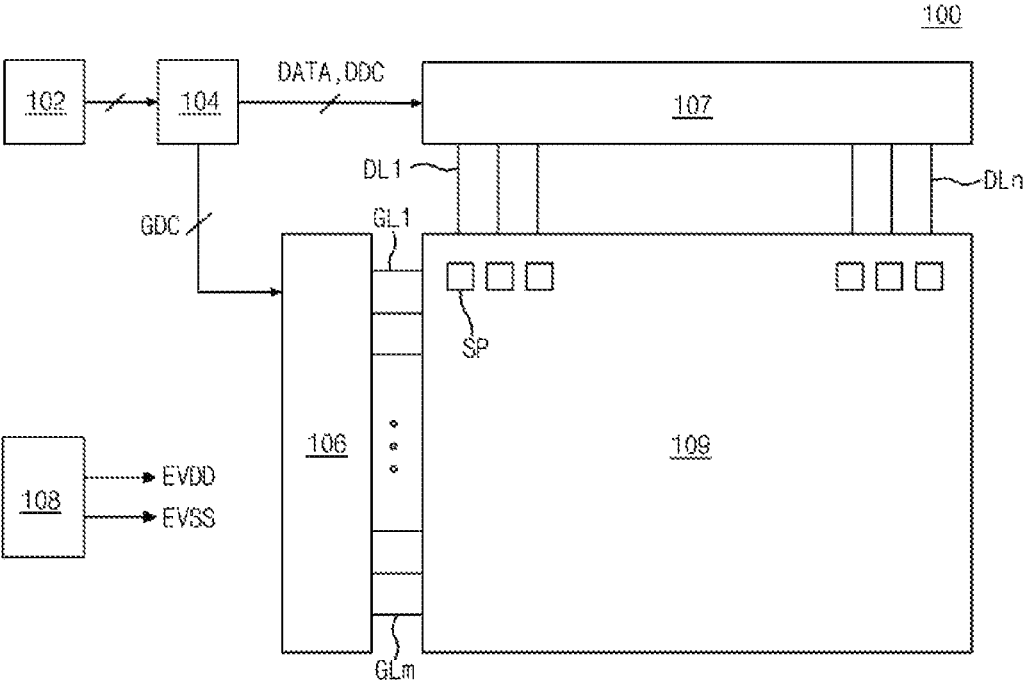
FIG. 1 is a schematic block diagram of an organic electroluminescent display apparatus according to aspects of the present disclosure.

Advantages and features of the present invention and methods of achieving them will be apparent with reference to various aspects described below in detail with the accompanying drawings. However, the present disclosure is not limited to the various aspects disclosed below and can be realized in a variety of different forms, and the disclosed aspects are provided as examples. The present disclosure is provided to fully inform the details for those skilled in the art to practice the disclosure, and the present disclosure is defined by the scope of the claims.

The shapes, sizes, proportions, angles, numbers, and the like disclosed in the drawings for explaining the aspects of the disclosure are illustrative, and the disclosure is not limited to the illustrated matters. The same reference numerals refer to the same components throughout the description. Furthermore, a detailed description of the related known technology that may unnecessarily obscure the subject matter of the present disclosure is omitted. The terms "including", "having'", "comprising", and the like used in this disclosure are inclusive, and other parts may be added unless the context indicates otherwise. When a component is expressed in the singular, the component may include the plural components unless a specific statement of the description indicates otherwise.

In interpreting the components, if a component is identified with a singular that is tangible or intangible (e.g., a capacitance), even if there is no separate explicit description, that property can be interpreted as including a margin range.

In the case of a description of a positional relationship, for example, when the positional relationship of two parts is described as "on", "over", "below", "beside", and the like, one or more other parts may be positioned between two parts unless "directly" is used.

In the case of a description of a temporal relationship, for example, when a temporal precedence is described as "after", "following", "next", "before", and the like, cases that are not continuous may be included unless a temporal relationship is explicitly described.

Although a first, a second and the like are used to describe various components, these components are not limited by these terms. These terms are only used to distinguish one component from another component and a numeric generic description does not imply any additional relationship other than they are similar components. Therefore, a first component mentioned below may be a second component within the technical spirit of the present disclosure.

Respective features of various embodiments of the present disclosure can be partially or wholly connected to or combined with each other and can be technically interlocked and driven variously, and respective aspects of the disclosure may be independently implemented from each other or may be implemented together with a related relationship.

Hereinafter, aspects according to the present disclosure are explained with reference to the drawings.

The present disclosure may be applied to various display apparatuses. For example, the present disclosure may be applied to various types of displays such as a liquid crystal display apparatus, an organic electroluminescent display apparatus, and an electrophoretic display apparatus. However, the organic electroluminescent display apparatus is described below for the convenience of the following explanations.

Figure 2:
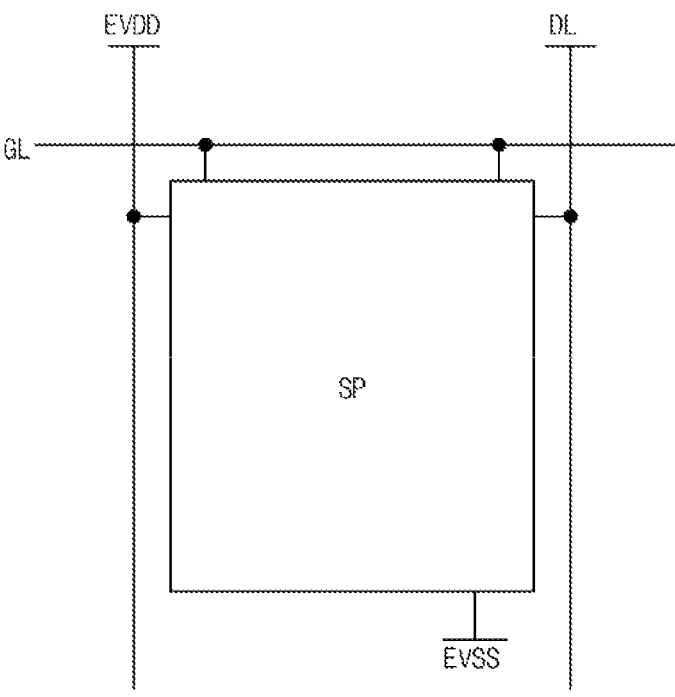
FIG. 2 is a schematic block diagram of a sub-pixel in FIG. 1.

FIG. 1 is a schematic block diagram of an organic electroluminescent display apparatus according to aspects of the present disclosure, and FIG. 2 is a schematic block diagram of a sub-pixel in FIG. 1.

As shown in FIG. 1, the organic electroluminescent display apparatus 100 may include an image processing portion 102, a timing control portion 104, a gate driving portion 106, a data driving portion 107, a power supply portion 108, and a display panel 109.

The image processing portion 102 may output driving signals for driving various devices based on image data received from a component outside of the image processing portion 102. For example, the image processing portion 102 may output a data enable signal, a vertical synchronization signal, a horizontal synchronization signal, a clock signal, and the like.

The timing control portion 104 may receive the driving signals from the image processing portion 102 and the image data. The timing control portion 104 may generate and output a gate timing control signal GDC for controlling an operation timing of the gate driving portion 106 and a data timing control signal DDC for controlling an operation timing of the data driving portion 107, based on the driving signals input from the image processing portion 102.

In response to the gate timing control signal GDC supplied from the timing control portion 104, the gate driving portion 106 may output scan signals to the display panel 109. The gate driving portion 106 may output the scan signals to the plurality of gate lines GL1 to GLm. In this case, the gate driving portion 106 may be configured in a form of an integrated circuit (IC), but is not limited thereto.

In response to the data timing control signal DDC input from the timing control portion 104, the data driving portion 107 may output data voltages to the display panel 109. The data driving portion 107 may sample and latch a digital data signal DATA supplied from the timing control portion 104 and convert the digital data signal DATA into an analog data voltage based on gamma voltages. The data driving portion 107 may output the data voltages to a plurality of data lines DL1 to DLn. In this case, the data driving portion 107 may be configured as an IC, but is not limited thereto.

The power supply portion 108 may output and supply a high potential voltage VDD and a low potential voltage VSS to the display panel 109. The high potential voltage VDD may be supplied to the display panel 109 through a first power line EVDD, and the low potential voltage VSS may be supplied to the display panel 109 through a second power line EVSS. At this time, the power supply portion 108 output the voltages and drive the gate driving portion 106 and/or the data driving portion 107.

The display panel 109 may display an image corresponding to the scan signal supplied from the gate driving portion 106 and the data voltages provided to the plurality of data lines DL1 to DLn by the data driving portion 107.

The display panel 109 may include a plurality of sub-pixels SP to display an image. The sub-pixels SP may include a red sub-pixel, a green sub-pixel, and a blue sub-pixel, or a white sub-pixel, a red sub-pixel, a green sub-pixel and a blue sub-pixel. In this case, the white, red, green, and blue sub-pixels SP may all have the same area or may have different areas.

As shown in FIG. 2, one sub-pixel SP may be connected to the gate line GL, the data line DL, the first power line EVDD, and the second power line EVSS. A number of transistors and capacitors and a driving method of the sub-pixel SP may be determined according to a configuration of a pixel circuit.

Figure 3:
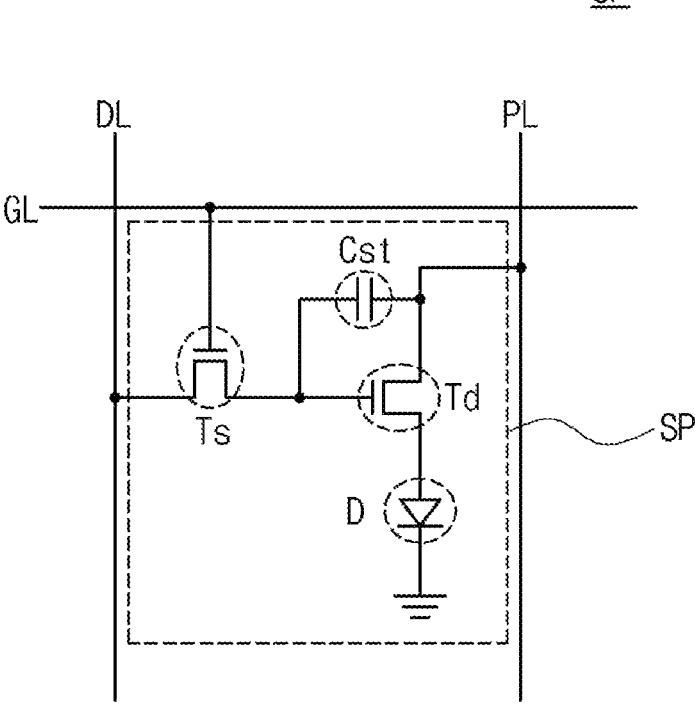
FIG. 3 is a circuit diagram conceptually illustrating a sub-pixel of the organic electroluminescent display apparatus according to aspects of the present disclosure.

FIG. 3 is a circuit diagram conceptually illustrating a sub-pixel of the organic electroluminescent display apparatus according to aspects of the present disclosure.

As shown in FIG. 3, the organic electroluminescent display apparatus according to aspects of the present disclosure may include a gate line GL, a data line DL, and a power line PL that cross each other and define a sub-pixel SP. A switching transistor Ts, a driving transistor Td, a storage capacitor Cst, and an organic light emitting element D may be disposed in the sub-pixel SP.

The switching transistor Ts may be connected to the gate line GL and the data line DL, and the driving transistor Td and the storage capacitor Cst may be connected between the switching transistor Ts and the power line PL. The organic light emitting element D may be connected to the driving transistor Td.

In the organic electroluminescent display apparatus having such the structure, when the switching transistor Ts is turned on based on the gate signal applied to the gate line GL, the data signal applied to the data line DL is applied to the gate electrode of the driving transistor Td and one electrode of the storage capacitor Cst.

The driving transistor Td is turned on according to the data signal applied to the gate electrode thereof, and as a result, a current proportional to the data signal flows from the power line PL to the organic light emitting element D through the driving transistor Td. Thus, the organic light emitting element D emits a light with a luminance proportional to the current flowing through the driving transistor Td.

At this time, the storage capacitor Cst is charged with a voltage proportional to the data signal, so that the voltage of the gate electrode of the driving transistor Td is constantly maintained for one frame.

Although only two transistors Td and Ts and one capacitor Cst are shown in the drawing, the present disclosure is not limited thereto, and three or more transistors and two or more capacitors may be provided.

Figure 4:
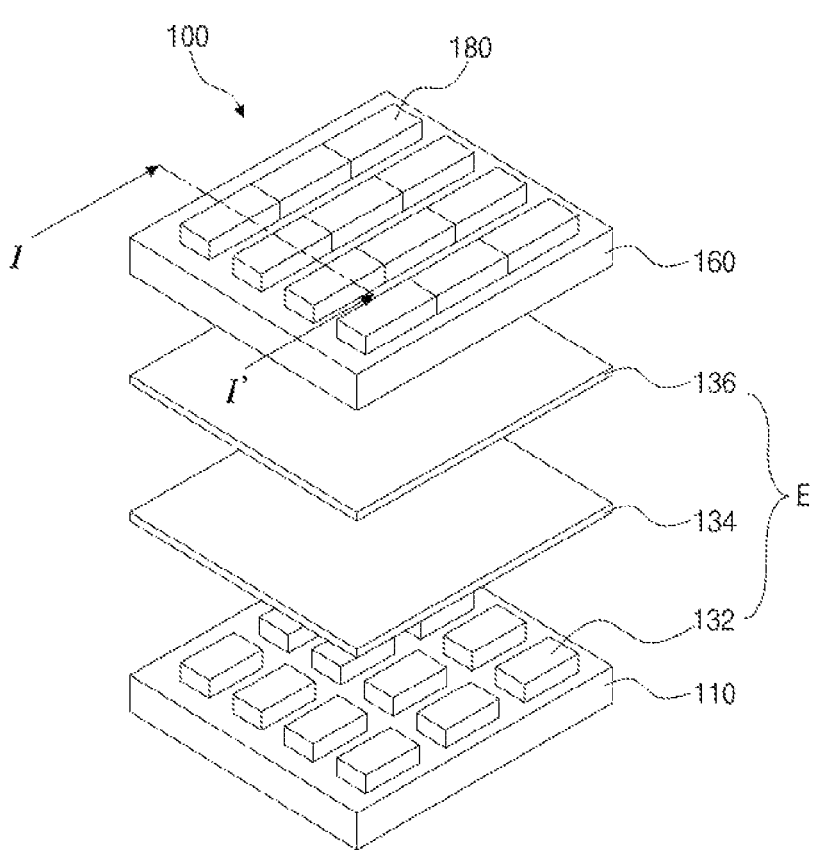
FIG. 4 is a perspective view schematically illustrating a structure of an organic electroluminescent display apparatus according to aspects of the present disclosure.

FIG. 4 is a perspective view schematically illustrating a structure of an organic electroluminescent display apparatus according to an aspect of the present disclosure.

In a first aspect, the organic electroluminescent display apparatus 100 according to aspects of the present disclosure may include various structures. Hereinafter, a Organic Light Emitting Diode on Silicon (OLEDOS) structure in which an organic light emitting element is formed on a silicon wafer substrate using a semiconductor process is explained. However, the present disclosure is not limited to the organic electroluminescent display apparatus 100 having such a structure.

As shown in FIG. 4, the organic electroluminescent display apparatus 100 according to the first aspect of the present disclosure may include a wafer substrate 110, a first electrode 132, an organic light emitting layer 134, a second electrode 136, an encapsulation layer 160 and a color filter layer 180.

The wafer substrate 110 may be a silicon wafer substrate formed using a semiconductor process. An active layer may be formed inside the wafer substrate 110, and a gate line, a data line, and a transistor may be disposed on the wafer substrate 110.

The first electrode 132, the organic light emitting layer 134, and the second electrode 136 are sequentially formed to form the organic light emitting element E. A plurality of red sub-pixels, green sub-pixels, and blue sub-pixels may have respective first electrodes 132 which are spaced apart from each other at a predetermined interval on the wafer substrate 110.

The organic light emitting layer 134 may be formed over the entire wafer substrate 110 to cover the wafer substrate 110 and the first electrodes 132. The organic light emitting layer 134 may be formed for all red, green, and blue sub-pixels to emit a white light from these sub-pixels.

The second electrode 136 may be formed on the organic light emitting layer 134. The second electrode 136 may be formed in common over all sub-pixels to apply a signal to all sub-pixels at the same time.

The encapsulation layer 160 may be formed on the second electrode 136 to prevent oxygen or moisture from penetrating into the organic light emitting element E. The encapsulation layer 160 may be configured with a plurality of layers. In one aspect, the encapsulation layer includes at least an inorganic layer and an organic layer.

The color filter layer 180 may be formed on the encapsulation layer 160. The color filter layer 180 may include a red color filter, a green color filter, and a blue color filter.

A light control member (e.g., the light control member LCU illustrated in FIG. 5) may be disposed between the encapsulation layer 160 and the color filter layer 180. The light control member (e.g., the light control member LCU of FIG. 5) may control a path of light, which is emitted from the organic light emitting layer 134 and incident to the color filter layer 180, to prevent light emitted from a specific sub-pixel from leaking into the color filter of an adjacent sub-pixel (e.g., prevent green light from leaking into the red color filter). In one aspect, the light control member LCU causes the light emitted from a specific sub-pixel to be input to a corresponding color filter. In addition, the light control member (e.g., the light control member LCU of FIG. 5) may permit light on the adjacent sub-pixel to pass into a corresponding sub-pixel on the adjacent sub-pixel, thereby improving an efficiency of light input to the corresponding sub-pixel and improving luminance of the organic electroluminescent display apparatus 100.

In the organic electroluminescent display apparatus 100 having the OLEDOS structure according to aspects of the present disclosure, since the active layer is formed in the wafer substrate 110 to form a transistor, a single crystal transistor having an excellent electrical mobility can be formed.

Accordingly, it is possible to significantly reduce a size of the sub-pixel, thereby manufacturing a high-resolution display apparatus.

In addition, in the organic electroluminescent display apparatus 100 having the OLEDOS structure, the transistors of the gate driving portion and the data driving portion can also be formed of single crystal transistors, which can increase a response speed of the display.

The organic electroluminescent display apparatus 100 of the OLEDOS structure can be applied to various fields. For example, the organic electroluminescent display apparatus 100 of the OLEDOS structure can be applied to a head mounted device (HMD) that provides a virtual reality (VR) and augmented reality (AR) experience. In some cases, the VR devices and AR devices are referred to as extended reality (XR) devices.

Figure 5:
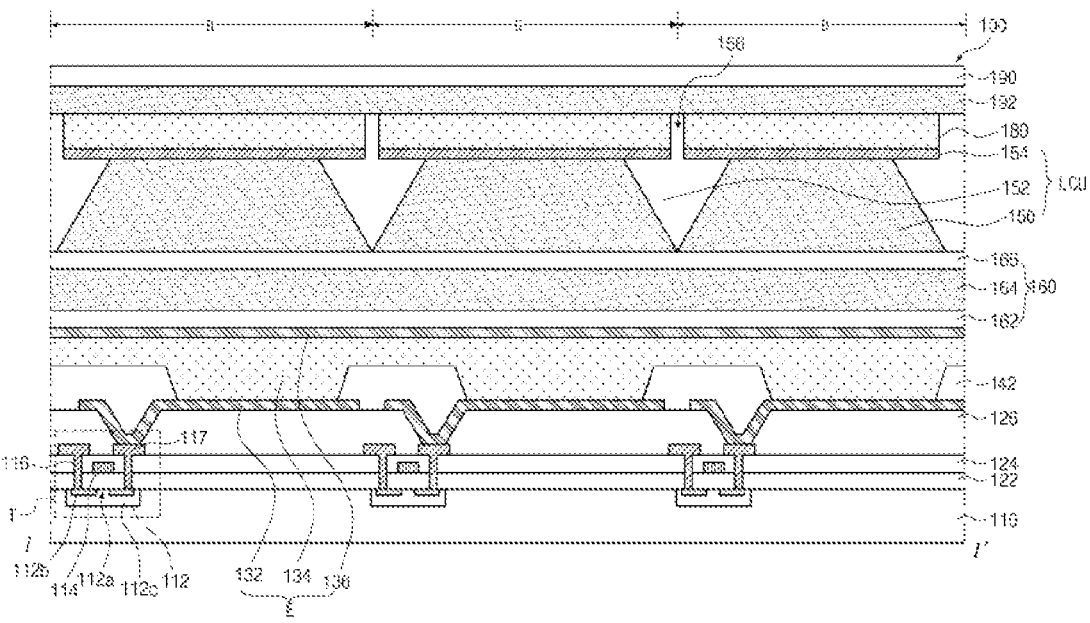
FIG. 5 is a cross-sectional view showing a structure of an organic electroluminescent display apparatus according to aspects of the present disclosure.

FIG. 5 is a cross-sectional view, taken along a line I-I' of FIG. 4, showing a structure of an organic electroluminescent display apparatus according to an aspect of the present disclosure. The organic electroluminescent display apparatus 100 may include red (R), green (G), and blue (B) sub-pixels.

As shown in FIG. 5, in the organic electroluminescent display apparatus 100 according to the first embodiment of the present disclosure, a transistor T may be disposed on a wafer substrate 110 of each of the sub-pixels R and G.

The transistor T may include an active region 112 disposed inside the wafer substrate 110, a gate insulating layer 122 formed on a top surface of the wafer substrate 110, a gate electrode 114 disposed on the gate insulating layer 122, an inter-layered insulating layer 124 formed on the gate insulating layer 122 and the gate electrode 114, and a source electrode 116 and a drain electrode 117 disposed on the inter-layered insulating layer 124.

The wafer substrate 110 may be a single crystal silicon wafer formed by growing single crystal silicon (Si), but is not limited thereto, and may be a wafer made of various semiconductor materials.

The active region 112 may be formed in the wafer substrate 110. A portion of the active region 112 of the wafer substrate 110 may be doped with impurities inside the wafer substrate 110 so that the active region 112 may include a central channel region 112a undoped with impurities, and a source region 112b and a drain region 112c located at both sides of the central channel region 112a and doped with impurities.

The gate insulating layer 122 may be formed of a single layer or a plurality of layers made of an inorganic material(s) such as SiOx and/or SiNx, but is not limited thereto.

The gate electrode 114 may be formed of a single layer or a plurality of layers made of a metal(s) such as Cr, Mo, Ta, Cu, Ti, Al, and/or an Al alloy, but is not limited thereto.

The inter-layered insulating layer 124 may be formed of a single layer or a plurality of layers made of an inorganic material(s) such as SiNx and/or SiOx, or may be formed of an organic material such as photoacrylic. In addition, the inter-layered insulating layer 124 may be configured with a plurality of layers of an organic material layer and an inorganic material layer.

The source electrode 116 and the drain electrode 117 may be formed of a single layer or a plurality of layers made of a metal(s) such as Cr, Mo, Ta, Cu, Ti, Al, and/or an Al alloy, but is limited thereto.

The source electrode 116 and the drain electrode 117 may be respectively in ohmic contact with the source region 112b and the drain region 112c of the active region 112 through contact holes formed in the gate insulating layer 122 and the inter-layered insulating layer 124.

A passivation layer 126 may be formed on the wafer substrate 110 on which the transistor T is formed. The passivation layer 126 may be made of an organic material such as photoacrylic, but is not limited thereto.

A bank layer 142 may be formed at a boundary of each sub-pixel on the passivation layer 126. The bank layer 142 may be a separation wall defining the sub-pixel. The bank layer 142 may partition the sub-pixels to prevent a light of a specific color output from an adjacent sub-pixel from being mixed and output.

An organic light emitting element E may be formed on the passivation layer 126 and may be connected to the drain electrode 117 of the transistor T through a contact hole formed in the passivation layer 126.

The organic light emitting element E may include a first electrode 132 formed between the bank layer 142 and connected to the drain electrode 117 of the transistor T through the contact hole of the passivation layer 126, an organic light emitting layer 134 formed on the first electrode 132 and the bank layer 142, and a second electrode 136 formed on the organic light emitting layer 134.

The first electrode 132 may be formed of a single layer or a plurality of layers made of a metal(s) such as Ca, Ba, Mg, Al, Ag, and/or an alloy thereof. The first electrode 132 may be connected to the drain electrode 117 of the transistor T. The first electrode 132 may be made of a transparent metal oxide such as indium tin oxide (ITO) or indium zinc oxide (IZO), or a metal having a good electrical conductivity.

When the first electrode 132 is made of a transparent metal oxide, although not shown in the drawing, a reflective electrode with a reflectance surface such as Al or Ag may be formed below the first electrode 132 to reflect a light incident on the first electrode 132, thereby improving a light efficiency.

The first electrode 132 may be formed for each sub-pixel.

The organic light emitting layer 134 may be formed on the first electrode 132 and the bank layer 142. The organic light emitting layer 134 may include at least one of a hole transporting layer, a hole injecting layer, a light emitting layer, an electron transporting layer, and an electron injecting layer.

The organic light emitting layer 134 may be a white organic light emitting layer emitting a white light and formed substantially over the entire display apparatus 100. The organic light emitting layer 134 may be formed with two or more stacks in a tandem structure. Each of the stacks may include a hole transporting layer, a light emitting layer, and an electron transporting layer.

The organic light emitting layer 134 may include a plurality of light emitting layers stacked in a tandem structure. For example, the light emitting layer may include a red (R) light emitting layer, a green (G) light emitting layer, and a blue (B) light emitting layer stacked in a tandem structure, so that a red light, a green light, and a blue light output from the respective light emitting layers may be mixed to output a white light. In this case, a hole transporting layer, an electron transport layer, and a charge generation layer may be disposed between such the light emitting layers in the tandem structure.

In addition, the light emitting layer may include a yellow-green light emitting layer and a blue (B) light emitting layer stacked in a tandem structure, so that a yellow-green light and a blue light emitted from the respective light emitting layers may be mixed to output a white light.

In the organic electroluminescent display apparatus 100 according to the first aspect of the present disclosure, a structure of the light emitting layer to output a white light is not limited to the above structure, but may have various structures. The organic light emitting layer 134 may be formed over the entire wafer substrate 110 by a deposition process or a solution process.

The second electrode 136 may be made of a transparent conductive material such as indium tin oxide (ITO) or indium zinc oxide (IZO), or a thin metal which can transmit a visible light, but is not limited thereto.

When voltages are applied to the first electrode 132 and the second electrode 136 in the organic light emitting element E, holes and electrons move to the light emitting layer through the hole transporting layer and the electron transporting layer, respectively, and are combined with each other in the light emitting layer to emit a light.

An encapsulation layer 160 may be formed on the second electrode 136. The encapsulation layer 160 may include a first encapsulation layer 162 made of an inorganic material, a second encapsulation layer 164 made of an organic material, and a third encapsulation layer 166 made of an inorganic material. In this case, the inorganic material may include, but is not limited to, SiNx and SiOx. In addition, the organic material may include, but is not limited to, polyethylene terephthalate, polyethylene naphthalate, polycarbonate, polyimide, polyethylene sulfonate, polyoxymethylene, polyarylate, or a mixture thereof.

However, in the organic electroluminescent display apparatus 100 according to the first aspect of the present disclosure, the encapsulation layer 160 is not limited to the triple-layered structure as described above, but may be formed in various structures. For example, the encapsulation layer 160 may have a double-layered structure of an inorganic layer and an organic layer, or may have a structure of four or more layers.

The light control member LCU may be disposed on the encapsulation layer 160. The light control member LCU may control a path of a light emitted from the organic light emitting layer 134 and incident thereon, so that light emitted from a specific sub-pixel (e.g., the R sub-pixel) is not leaded into to an adjacent sub-pixel (e.g., the G sub-pixel). In addition, the light control member LCU may improve a luminance of the display apparatus 100 by concentrating a light going to the adjacent sub-pixel to improve efficiency of a light input to the corresponding sub-pixel.

The light control member LCU may include a light control pattern 150, a support member 154, and an air layer 152 between each light control pattern 150 and support member 154. The light control pattern 150 may extend along the sub-pixel of the organic electroluminescent display apparatus 100, and may be formed in a pyramidal (or tapered) cross section whose width becomes narrower from a bottom to a top.

The support member 154 may be formed on a top (or upper) surface of the light control pattern 150 of each sub-pixel. A portion of a bottom surface of the support member 154 may overhang a top surface of the light control pattern 150. The support member 154 may be spaced apart from the light control pattern 150 of an adjacent sub-pixel by a predetermined distance by forming an opening 156 between the two adjacent support members 154. The support member 154 may be formed to have a larger area than the top surface of the light control pattern 150, so that the support member 154 may extend to both sides from the light control pattern 150, and a bottom (or lower) surface of the support member 154 may be formed in a form of an undercut with both side surfaces of the light control pattern 150.

The air layer 152 may be defined as an empty space formed by the light control pattern 150 and the support member 154. That is, the air layer 152 may be an empty space formed by a valley of the light control pattern 150 and the support member 154 in a form of an undercut.

As illustrated in FIG. 5, the air layer 152 may increase in width from the bottom to the top. In the aspect illustrated in FIG. 5, the air layer 152 has an inverted triangular cross-section, but the air layer 152 may have an inverted pyramidal cross-section. The cross-section of the air layer 152 may be formed in various shapes according to the cross-sectional shape of the light control pattern 150. The air layer 152 may be connected to the opening 156 formed between the support members 154.

The light control pattern 150 may be made of an inorganic material such as SiOx or SiNx. Alternatively, the light control pattern 150 may be made of an organic material. The light control pattern 150 may concentrate a light emitted from the organic light emitting element E to improve a light efficiency of an organic electroluminescent display apparatus 100.

When a light emitted from the organic light emitting element E propagates into the light control pattern 150 and is incident on an interface between the light control pattern 150 and the air layer 152, the light is refracted by a difference in refractive index between the light control pattern 150 and the air layer 152. A light incident to a boundary of the light control pattern 150 may be reflected based on a difference in a refractive index between the light control pattern 150 and an adjacent material. In one aspect, the refractive index of the air layer 152 is 1, the refractive index of SiOx is approximately 1.45, and the refractive index of SiNx is approximately 1.5. In addition, in general, an organic material, such as a resin, has a higher refractive index than an inorganic material, approximately 2.0 or more. Accordingly, when a light emitted from the organic light emitting element E of a specific sub-pixel propagates into an adjacent sub-pixel and the light is incident at an interface between the light control pattern 150 and the air layer 152 at a higher angle than a critical angle, the light is totally reflected and input to the corresponding sub-pixel. Accordingly, since a light leaked laterally is again supplied to the corresponding sub-pixel, an intensity of a light output through the corresponding sub-pixel is increased to improve a luminance of the organic electroluminescent display apparatus 100.

The color filter layer 180 may be formed on the top surface of the support member 154. The support member 154 may be made of an etch-resistant inorganic material, organic material, or transparent metal oxide, and may prevent the color filter layer 180 from collapsing into the air layer 152 and maintains the structural integrity of the color filter layer 180.

When the air layer 152 always maintains a constant shape, a degree of concentration of a light by the light control member LCU of each sub-pixel becomes constant, and a constant luminance can be maintained in all sub-pixels. For example, when the support member 154 deforms with the color filter layer 180, the shape of the air layer 152 is changed and the shape of the light control pattern 150 is also changed by a weight of the support member 154. The shape change of the air layer 152 and the light control pattern 150 distorts a light reflection by the air layer 152 and the light control pattern 150 so that a distribution of light condensed to the sub-pixels is distorted and a luminance distribution is not uniform.

To prevent this problem, the support member 154 needs to maintain a flat state. In the present disclosure, to keep the support member 154 constant, the support member 154 disposed in each sub-pixel may be combined with the support member 154 of an adjacent sub-pixel to prevent the support member 154 from deforming.

Figure 6A:
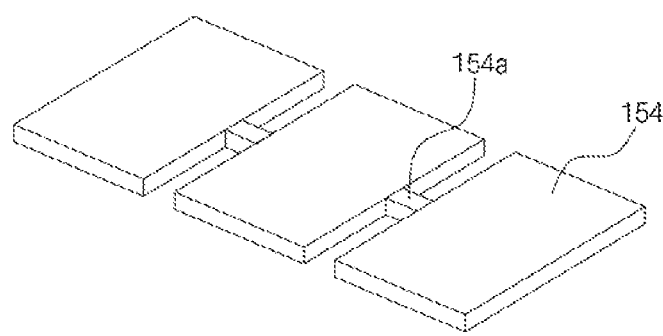
FIGS. 6A and 6B are views illustrating structures of support members of an organic electroluminescent display apparatus according to aspects of the present disclosure.
Figure 6B:
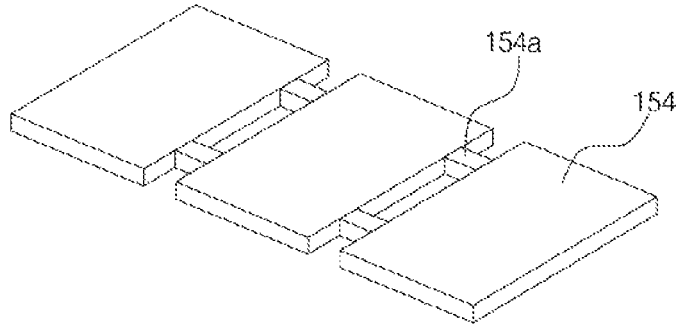

That is, as shown in FIGS. 6A and 6B, one connecting member 154a or a plurality of connecting members 154a may be formed between the support members 154 of the adjacent sub-pixels to couple the support members 154 of the adjacent sub-pixels to each other. Thus, it is possible to prevent deformation of the support members 154. In some aspects, the support members 154 of the adjacent sub-pixels may be coupled in various ways.

Since the support member 154 may be formed only in the corresponding sub-pixel and the opening 156 is formed between the support members 154 of the adjacent sub-pixels, the color filter layer 180 formed on the top surface of the support member 154 may be also formed to have the opening 156 at a boundary region of the sub-pixel.

Since the opening 156 is an empty space and circulates with the air layer 152, the opening 156 may also be regarded as an air layer.

An adhesive 192 may be disposed on the color filter layer 180, and a protective member 190 may be disposed on the adhesive 192, so that the protective member 190 may be attached to the color filter layer 180 by the adhesive 192.

The protective member 190 may protect and encapsulate the organic electroluminescent display apparatus 100 and may be formed of glass or a transparent film. Non-limiting examples of a transparent protective film include a polystyrene (PS) film, a polyethylene (PE) film, a polyethylene naphthalate (PEN) film, or a polyimide (PI) film.

The adhesive 192 may use a transparent optical adhesive (e.g., optical clear adhesive; OCA), but is not limited thereto, and various other adhesive members may be used.

As described above, in the organic electroluminescent display apparatus 100 according to the first aspect of the present disclosure, since the transistor T is formed on the wafer substrate 110 made of a single crystal semiconductor rather than a glass or plastic film, even when the area of the sub-pixel is greatly reduced, a desired high-quality image can be provided, thereby enabling a realization of the high-resolution display apparatus 100.

Furthermore, in the organic electroluminescent display apparatus 100 according to the first aspect of the present disclosure, a black matrix for preventing a light leakage between the sub-pixels R and G is not formed, a finer sub-pixel can be formed. This makes it possible to realize the organic electroluminescent display apparatus 100 having a super high resolution.

In the organic electroluminescent display apparatus 100 according to the first aspect of the present disclosure, the light control member LCU is disposed below the color filter layer 180 to concentrate a light emitted from the organic light emitting element E. Thus, it is possible to prevent defects due to a color mixing with the adjacent sub-pixel and to improve a light efficiency of the organic electroluminescent display apparatus 100. An example of a defect due to color blending is described in detail below.

Figures 7, 8:
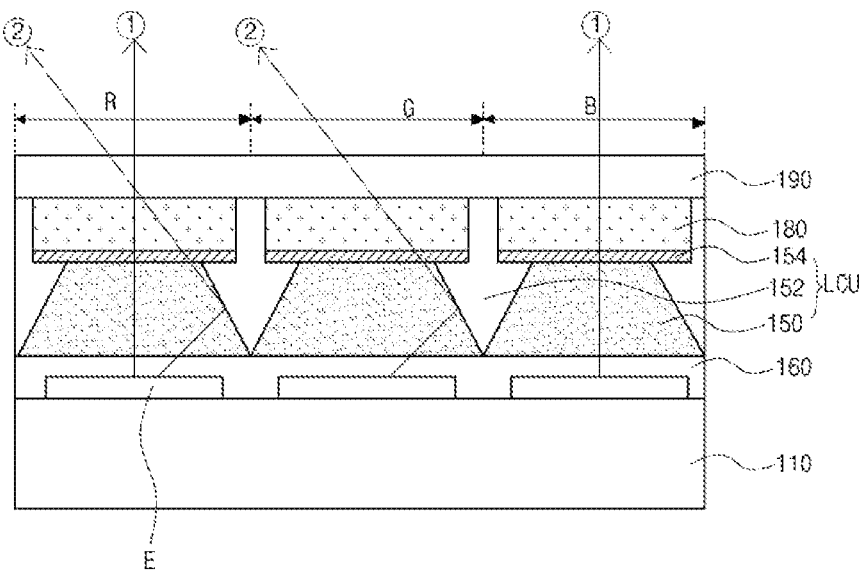
FIG. 7 is a view illustrating an output path of light emitted from an organic light emitting element of an organic electroluminescent display apparatus in which a light control member LCU is not provided.
FIG. 8 is a view illustrating an output path of a light emitted from an organic light emitting element of an organic electroluminescent display apparatus according to aspects of the present disclosure.

FIG. 7 is a view illustrating an output path of light emitted from an organic light emitting element of an organic electroluminescent display apparatus in which a light control member LCU is not provided.

As shown in FIG. 7, a white light emitted from the sub-pixels R, G, and B passes through the color filter layer 180 and is output. At this time, regarding the white light passing through the R color filter, a light of a different wavelength band is absorbed and only a red light is output. Regarding the white light passing through the G color filter, a light of a different wavelength band is absorbed and only a green light is output. Regarding the white light passing through the B color filter, a light of a different wavelength band is absorbed and only a blue light is output.

However, in the organic electroluminescent display apparatus having such the structure, a black matrix is not disposed between the R, G, and B color filters to realize a high resolution, and a light passing through a specific sub-pixel may be output through other adjacent sub-pixel regions.

For example, lights ① and ③ that pass through the R, G, and B color filters vertically are output through the R, G, and B sub-pixels without any filtering.

The color filter layer 180 includes R, G, and B color filters having similar refractive indices, and the R, G, and B color filters are in contact with each other at the interfaces between the sub-pixels. Thus, the interfaces of the sub-pixels have substantially similar refractive indices. Accordingly, a light incident to a specific sub-pixel at a predetermined angle and incident to the interface with the adjacent sub-pixel is output through the adjacent sub-pixel as it is without refraction.

In particular, since a black matrix is not provided between the R, G, and B sub-pixels in a high-resolution organic electroluminescent display apparatus as in the present disclosure, a light incident on an interface with the adjacent sub-pixel is directly output through the adjacent sub-pixel.

For example, a light ② is input into the R color filter at a certain angle and is incident on the interface between the R sub-pixel and the G sub-pixel. Based on the angle of incidence, the incident light is input to the G sub-pixel without refraction or reflection. Thus, not all light output from the R sub-pixel is output from the R sub-pixel, and some light leaks into and is output through the adjacent G sub-pixel. Accordingly, a mixture of different colors of red light and green light is generated in the G sub-pixel, so that a spot due to a light leakage is generated on a screen.

FIG. 8 is a view illustrating an output path of a light emitted from an organic light emitting element of an organic electroluminescent display apparatus according to the first aspect of the present disclosure.

As shown in FIG. 8, in the organic electroluminescent display apparatus 100 according to the first embodiment of the present disclosure, the light control member LCU including the light control pattern 150, the air layer 152 and the support member 154 is formed on the encapsulation layer 160. The support member 154 is formed in each of the R, G and B sub-pixels and is spaced apart from the support member 154 of the adjacent sub-pixel by the opening 156. The color filter layer 180 is formed on the support member 154, and the color filter layer 180 includes R, G and B color filters formed in the R, G and B sub-pixels, respectively.

Since the R, G, and B color filters are formed only on the support members 154 of the corresponding sub-pixels, the adjacent R, G, and B color filters are spaced apart from each other by a predetermined distance, so that the opening 156 and the corresponding the air layer 152 is evenly formed between the R, G, and B color filters.

In the organic electroluminescent display apparatus 100 having such the structure, a white light emitted from the organic light emitting element E of the R, G, and B sub-pixels propagates through the encapsulation layer 160 and the light control member LCU and then is output through the color filter layer 180 thereon. For example, the white light emitted from the organic light emitting element E of the R sub-pixel propagates through the encapsulation layer 160 and the light control member LCU, and then passes through the R color filter while a light in a different wavelength band is absorbed, so that only a red light is output. The white light emitted from the organic light emitting element E of the B sub-pixel propagates through the encapsulation layer 160 and the light control member LCU, and then passes through the B color filter while a light in a different wavelength band is absorbed, so that only a blue light is output. The white light emitted from the organic light emitting element E of the G sub-pixel propagates through the encapsulation layer 160 and the light control member LCU, and then passes through the G color filter while a light in a different wavelength band is absorbed, so that only a green light is output.

Light ① emitted from the organic light emitting element E of the sub-pixel propagates upward through the encapsulation layer 160 and the light control member LCU and then is output through the corresponding color filter.

Light ② emitted from the organic light emitting element E of the sub-pixel and output in the upward direction at a predetermined angle propagates toward the adjacent sub-pixel in the light control member LCU and is incident on the interface between the light control pattern 150 and the air layer 152 of the light member LCU.

The light control pattern 150 has a higher refractive index compared to the air layer 152, thus the light incident on the interface between the light control pattern 150 and the air layer 152 is caused to be reflected at the interface between the light control pattern 150 and the air layer 152. In other words, the light propagating towards the adjacent sub-pixel is reflected and then output through the color filter layer 180 of the corresponding sub-pixel.

Accordingly, in the organic electroluminescent display apparatus 100 according to the first aspect of the present disclosure, the light emitted from the organic light emitting element E of the corresponding sub-pixel does not penetrate into the adjacent sub-pixel and all light is output through the corresponding color filter. Defects caused by color mixing with the adjacent sub-pixel is prevented, and a luminance in the corresponding sub-pixel is significantly increased.

Furthermore, in the organic electroluminescent display apparatus 100 according to the first aspect of the present disclosure, the air layer 152 is also formed between the R, G, and B color filters. Thus, due to the difference in refractive index between the color filter layer 180 and the air layer 152, a light propagating toward the adjacent sub-pixel in the color filter layer 180 is reflected and output through the corresponding color filter. Accordingly, defects caused by color mixing with the adjacent sub-pixel are more effectively prevented, and a luminance in the corresponding sub-pixels is further increased.

According to aspects of the present disclosure, by providing the light control member LCU, a light efficiency is improved by about 10-25% compared to a general organic electroluminescent display apparatus, and by this improvement of the light efficiency, a luminance of the organic electroluminescent display apparatus can be improved.

FIGS. 9A to 9G are views illustrating a method of manufacturing an organic electroluminescent display apparatus according to the first embodiment of the present disclosure.

Figure 9A:
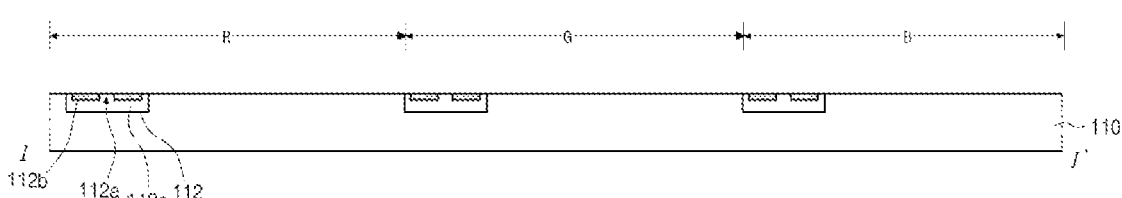
FIGS. 9A to 9G are views illustrating a method of manufacturing an organic electroluminescent display apparatus according aspects of the present disclosure.

First, as shown in FIG. 9A, after preparing a wafer substrate 110 formed by growing a single crystal semiconductor material such as single crystal silicon, impurities are doped into each sub-pixel of the wafer substrate 110. By doping the sub-pixels with impurities, an active region 112 including a source region 112b, a drain region 112c, and a central channel region 112a undoped with impurities may be formed in the wafer substrate 110.

Figure 9B:
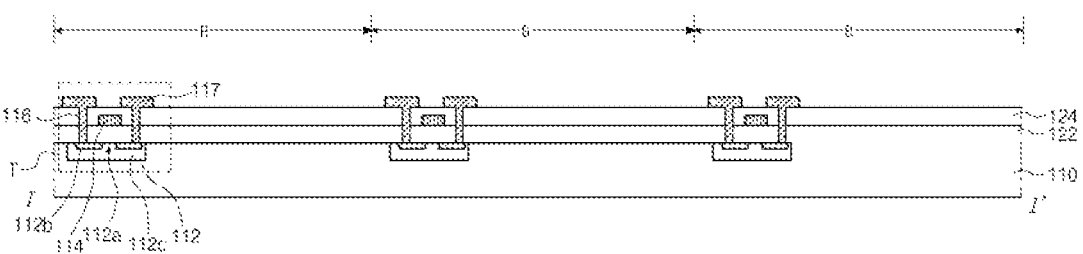

Subsequently, as shown in FIG. 9B, a gate insulating layer 122 may be formed by laminating an inorganic material such as SiOx or SiNx as a single layer or a plurality of layers using a chemical vapor deposition (CVD) method. A metal may be deposited on the gate insulating layer 122 and the metal may be etched to form a gate electrode 114.

Thereafter, an inorganic material may be laminated to form an inter-layered insulating layer 124 of a single layer or a plurality of layers. Then, a metal may be laminated and etched to form a source electrode 116 and a drain electrode 117 electrically connected to the source region 112b and the drain region 112c of the active region 112 through respective contact holes. Accordingly, the transistor T may be completed.

Figure 9C:
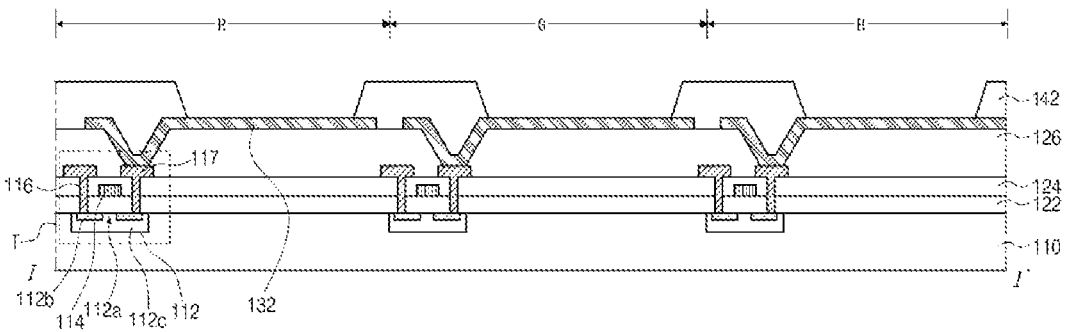

Subsequently, as shown in FIG. 9C, a passivation layer 126 may be formed by laminating an organic material or laminating an inorganic material and an organic material on the transistor T. Then, a transparent conductive material such as ITO or IZO, or a metal may be laminated and etched to form a first electrode 132 in each sub-pixel. At this time, although not shown in the drawings, when the first electrode 132 is formed of a transparent conductive material, a metal having a good reflectance such as Al or Ag may be laminated on the passivation layer 126 to form a reflective electrode before the first electrode 132 is formed and etched.

Figure 9D:
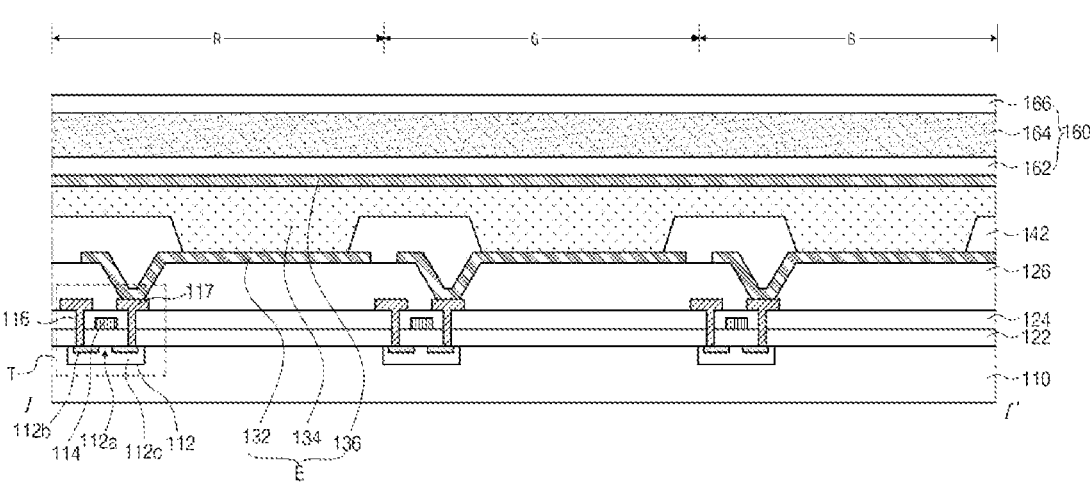

Thereafter, the bank layer 142 may be formed on the passivation layer 126 on which the first electrode 132 is formed. Then, as shown in FIG. 9D, an organic light emitting material may be coated over the entire wafer substrate 110 to form an organic light emitting layer 134.

Next, a second electrode 136 may be formed by laminating a transparent conductive material such as ITO or IZO entirely over the organic light emitting layer 134 in a sputtering method.

Subsequently, an encapsulation layer 160 may be formed on the second electrode 136. The encapsulation layer 160 may include a first encapsulation layer 162, a second encapsulation layer 164, and a third encapsulation layer 166. The first encapsulation layer 162 may be formed entirely over the wafer substrate 110. The first encapsulation layer 162 may be formed by laminating an inorganic material such as SiOx or SiNx using a CVD method. The second encapsulation layer 164 may be formed by coating an organic material such as polyethylene terephthalate, polyethylene naphthalate, polycarbonate, polyimide, polyethylene sulfonate, polyoxymethylene, or polyarylate. The third encapsulation layer 166 may be formed by laminating an inorganic material such as SiNx and SiOx by a CVD method.

Figure 9E:
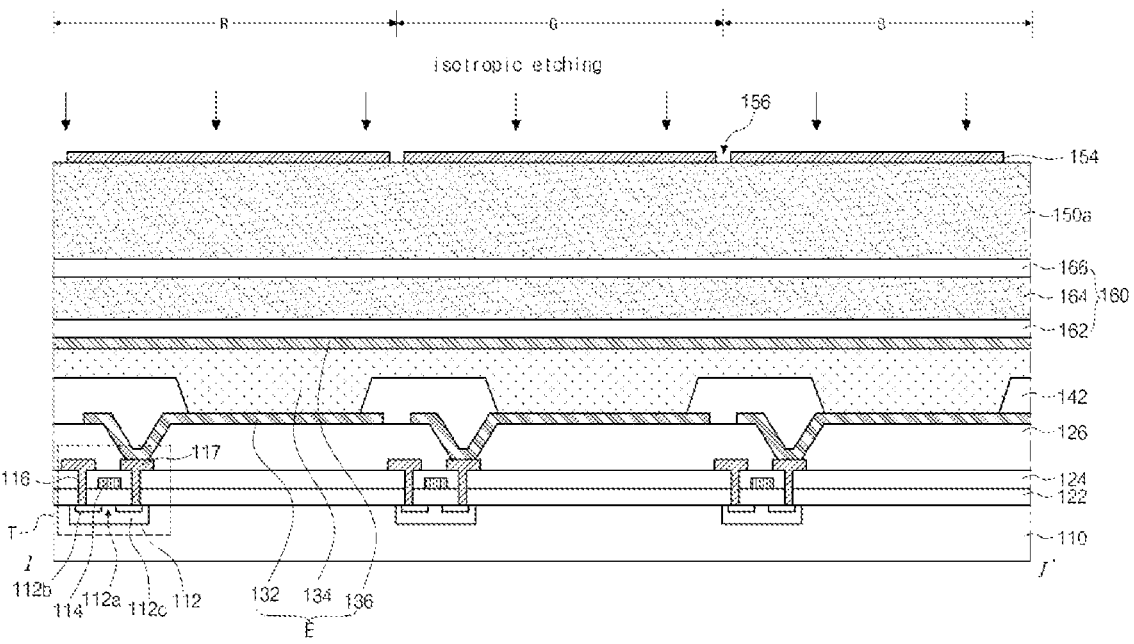

Next, as shown in FIG. 9E, after laminating an insulating layer 150a made of an inorganic material such as SiOx or SiNx or an organic material such as a resin on the encapsulation layer 160, a support layer made of an organic material or transparent metal oxide material having an etch resistance is laminated and etched to form a support member 154 on the insulating layer 150a. Portions of the support layer may be removed to form a plurality of openings and a plurality support members. By the etching, the support member 154 is formed only in sub-pixel, and an opening 156 is formed between the adjacent sub-pixels. Alternatively, portions of rows and portions of columns of the support layer may be removed to form a lattice of connected support members, with each support member being attached to an adjacent support member.

Thereafter, when the insulating layer 150a is etched using the support member 154 as an etching mask, the etching gas penetrates into the insulating layer 150a through the opening 156 between the support members 154 to isotropically etch the insulating layer 150a. Thus, as shown in FIG. 9F, the insulating layer 150a is etched around the opening 156, so that a pyramid-shaped light control pattern 150 whose width increases from top to bottom is formed below the support member 154, and an air layer 152 is formed between the light control patterns 150.

Next, a color filter layer 180 is formed on the light control pattern 150. For example, the color filter layer 180 may be formed by coating an R color resist on the support member 154 and etching the R color resist to form an R color filter, coating a G color resist on the support member 154 and etching the G color resist to form an G color filter, and coating a B color resist on the support member 154 and etching the B color resist to form a B color filter. In this case, the R, G, and B color filters of the color filter layer 180 are spaced apart from each other by a predetermined distance, and the opening 156 which the air layer 152 circulates with is formed between the R, G, and B color filters.

Figure 9F:
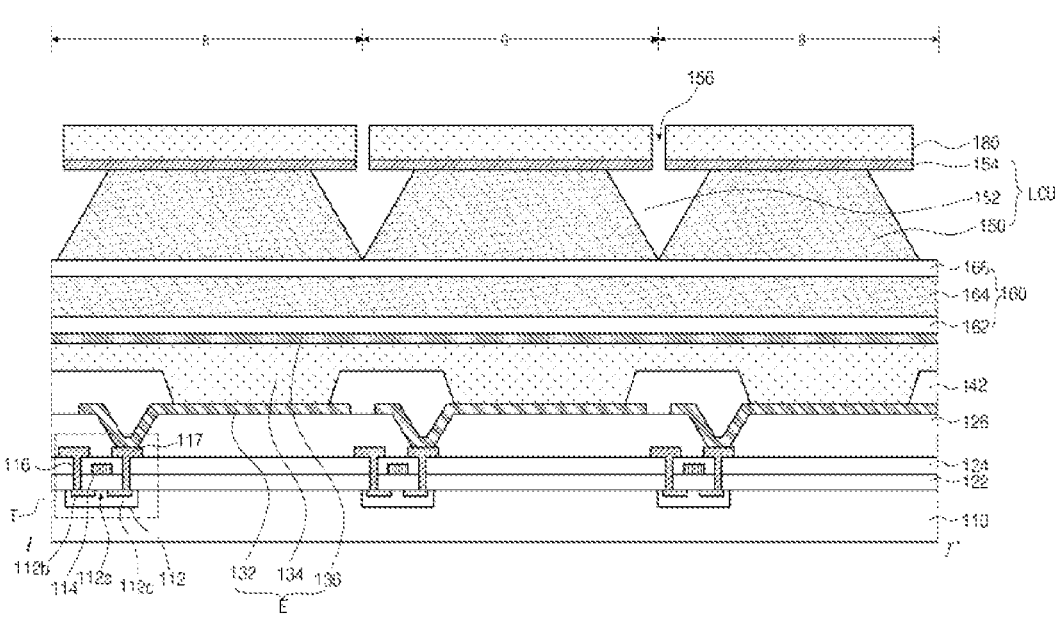

FIGS. 9E-9F illustrate one aspect of forming a color filter layer 180. Other aspects include forming the color filter layer 180 by other methods.

Figure 9G:
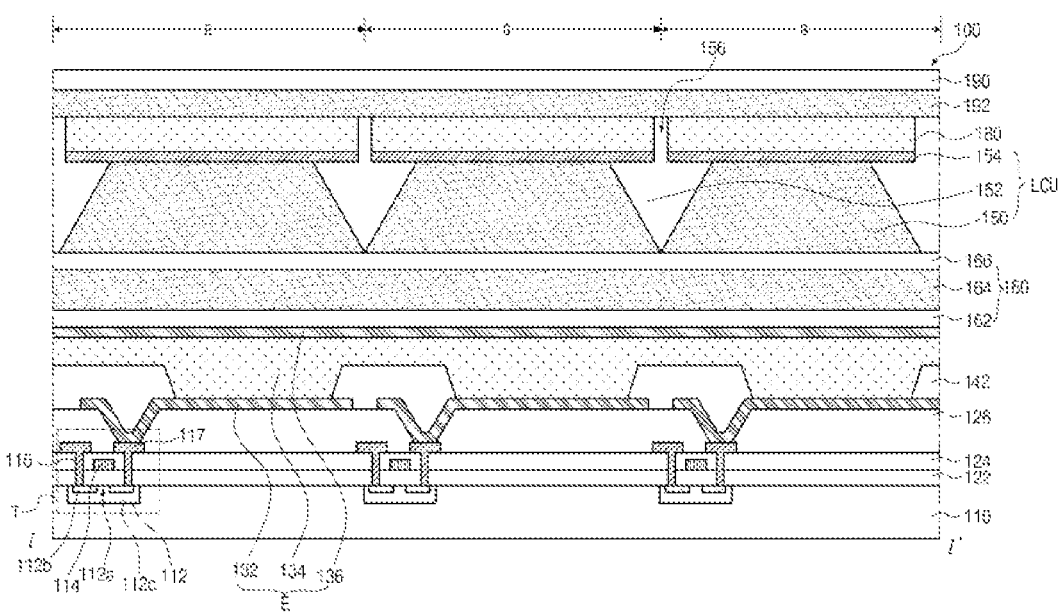

Thereafter, as shown in FIG. 9G, a protective member 190 is attached to the color filter layer 180 using an adhesive 192 such as OCA, thereby completing the organic electroluminescent display apparatus 100.

As described above, in the organic electroluminescent display apparatus 100 according to the first aspect of the present disclosure, an isotropic etching is performed using the support member 154 as an etch mask to form the light control pattern 150 having a pyramid shape.

However, the light control pattern 150 of the organic electroluminescent display apparatus 100 according to aspects of the present disclosure is not formed only in a pyramid shape and may be formed in various other shapes.

Figure 10:
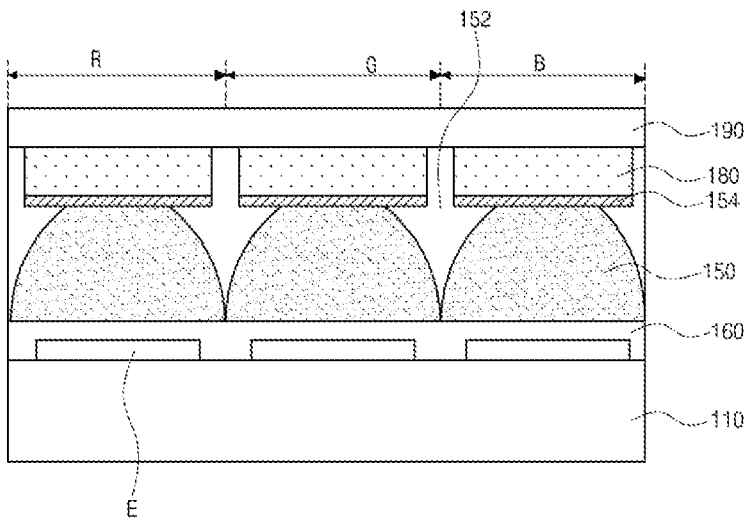
FIG. 10 is a cross-sectional view showing another structure of an organic electroluminescent display according to aspects of the present disclosure.

For example, as shown in FIG. 10, the light control pattern 150 may be formed in a shape such as a convex lens. Since the light control pattern 150 having this shape also concentrates a light emitted from the organic light emitting element E to the corresponding sub-pixel, it is possible to prevent defects due to color mixing with other sub-pixel and to improve a luminance.

Figure 11:
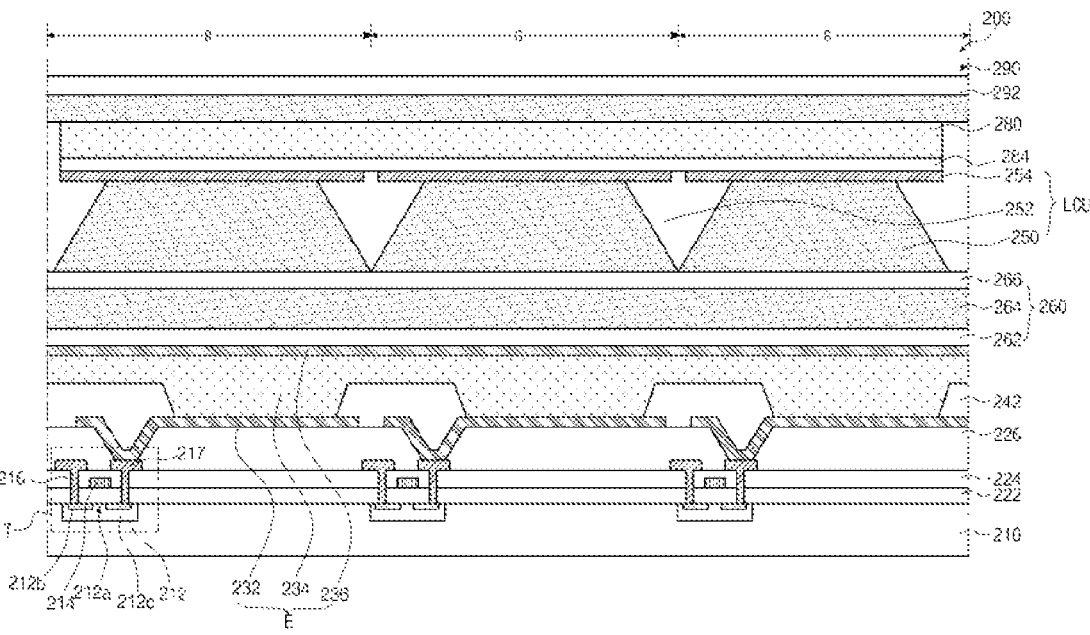
FIG. 11 is a cross-sectional view showing a structure of an organic electroluminescent display apparatus according to aspects of the present disclosure.

FIG. 11 is a cross-sectional view illustrating a structure of an organic electroluminescent display apparatus according to a second aspect of the present disclosure. The same structures as those of the first embodiment shown in FIG. 5 may be omitted or simplified, and only other structures may be described in detail.

As shown in FIG. 11, in the organic electroluminescent display apparatus 200 of this aspect, a light control member LCU including a pyramid-shaped or lens-shaped light control pattern 250, a support member 254, and an air layer 252 on an encapsulation layer 260 of each sub-pixel may be formed. The transistor T may include an active region 212 disposed inside the wafer substrate 210, a gate insulating layer 222 formed on a top surface of the wafer substrate 210, a gate electrode 214 disposed on the gate insulating layer 222, an inter-layered insulating layer 224 formed on the gate insulating layer 222 and the gate electrode 214, and a source electrode 216 and a drain electrode 217 disposed on the inter-layered insulating layer 224. The active region 212 may include a central channel region 212*a* undoped with impurities, and a source region 212*b* and a drain region 212*c* located at both sides of the central channel region 212*a* and doped with impurities. A bank layer 242 may be formed at a boundary of each sub-pixel on a passivation layer 226. An organic light emitting element E may include a first electrode 232, an organic light emitting layer 234 and a second electrode 236. An encapsulation layer 160 may be formed on the second electrode 236. The encapsulation layer 260 may include a first encapsulation layer 262 made of an inorganic material, a second encapsulation layer 264 made of an organic material, and a third encapsulation layer 266 made of an inorganic material. A protective member 290 may be attached to a color filter layer 280 by an adhesive 292.

Accordingly, the light control member LCU may control a path of a light emitted from the organic light emitting layer 234 and incident thereon to prevent a light emitted from a specific sub-pixel (e.g., the R sub-pixel) from being input to an adjacent sub-pixel (e.g., the G sub-pixel). In addition, the light control member LCU may improve a luminance of the organic electroluminescent display apparatus 200 by concentrating a light going to the adjacent sub-pixel to improve an intensity of a light input to the corresponding sub-pixel.

A planarization layer 284 may be formed on the support member 254, and a color filter layer 280 may be formed on the planarization layer 284. The planarization layer 284 may be made of an organic material such as photo-acryl and is not limited thereto.

The planarization layer 284 may block penetration of moisture or impurities from the outside and also allows the color filter layer 280 to be stably formed on the support member 254. That is, as the planarization layer 284 is formed, the encapsulating characteristics of the organic electroluminescent display apparatus 200 is improved and a structural stability of the organic electroluminescent display apparatus 200 is improved.

The planarization layer 284 may not be formed for each sub-pixel, but may be formed over the entire sub-pixels, and the color filter layer 280 formed on the planarization layer 284 may be also formed over the entire sub-pixels, not separately for each sub-pixel. That is, in the organic electroluminescent display apparatus 200 of this embodiment, adjacent color filters may be formed to contact each other.

However, even in the organic electroluminescent display apparatus 200 of this aspect, the planarization layer 284 is formed over the entire sub-pixels and the color filter layer 280 formed on the planarization layer 284 may be configured such that an air layer may be formed between the R, G, and B color filters which are spaced apart from each other at a predetermined interval.

Therefore, due to a difference in refractive index between the color filter layer 280 and the air layer, a light propagating to an adjacent sub-pixel in the color filter layer 280 is also reflected and output through the corresponding color filter. Thus, it is possible to more effectively prevent defects caused by color mixing with the adjacent sub-pixel and to further increase a luminance of the corresponding sub-pixel.

Figure 12:
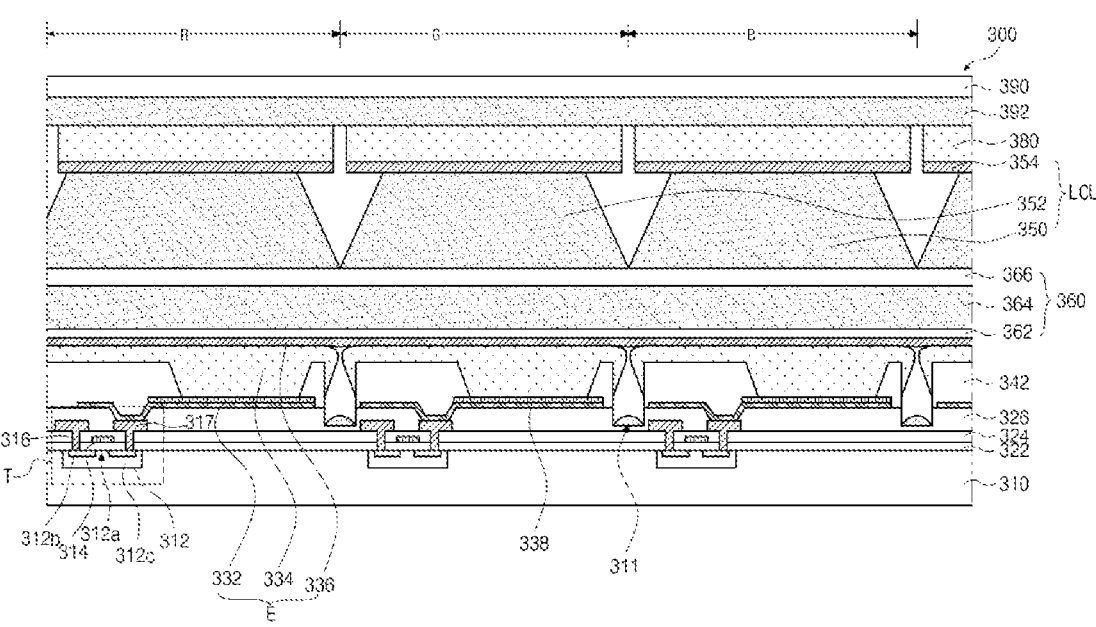
FIG. 12 is a cross-sectional view showing a structure of an organic electroluminescent display apparatus according to aspects of the present disclosure.

FIG. 12 is a cross-sectional view showing a structure of an organic electroluminescent display apparatus according to a third aspect of the present disclosure. The same structures as those of the first embodiment shown in FIG. 5 may be omitted or simplified, and only other structures may be described in detail.

As shown in FIG. 12, in the organic electroluminescent display apparatus 300 of this embodiment, a transistor T may be formed on a wafer substrate 310 of each sub-pixel. The transistor T may include an active region 312 disposed inside the wafer substrate 310, a gate insulating layer 322 formed on a top surface of the wafer substrate 310, a gate electrode 314 disposed on the gate insulating layer 322, an inter-layered insulating layer 324 formed on the gate insulating layer 322 and the gate electrode 314, and a source electrode 316 and a drain electrode 317 disposed on the inter-layered insulating layer 324. The active region 312 may include a central channel region 312*a* undoped with impurities, and a source region 312*b* and a drain region 312*c* located at both sides of the central channel region 312*a* and doped with impurities. An encapsulation layer 360 may include a first encapsulation layer 362 made of an inorganic material, a second encapsulation layer 364 made of an organic material, and a third encapsulation layer 366 made of an inorganic material. A protective member 390 may be attached to a color filter layer 380 by an adhesive 392.

A passivation layer 326 may formed on the wafer substrate 310 having the transistor T, and a bank layer 342 is formed at a boundary between the sub-pixels on the passivation layer 326. In addition, an organic light emitting element E may be formed on the passivation layer 326. The organic light emitting element E may include a first electrode 332 formed between the bank layers 342 and connected to the drain electrode 317 of the transistor T through a contact hole, an organic light emitting layer 334 formed on the first electrode 332 and the bank layer 342 and a second electrode 336 formed on the organic light emitting layer 334.

A trench 311 may be formed at the boundary of each sub-pixel. The trench 311 may prevent a leakage current from occurring between the adjacent sub-pixels. The trench 311 may be formed to penetrate the bank layer 342 and at least a portion of the passivation layer 326.

In a case that a distance between the sub-pixels is densely configured to realize a high resolution, when a light is emitted from a light emitting layer in one sub-pixel, charges in the light emitting layer move to a light emitting layer in another adjacent sub-pixel, and thus there is a possibility that a leakage current may occur. Accordingly, by forming the trench 311 between the sub-pixels, a part or all of the organic light-emitting layer 334 formed in the trench 311 is cut off, thereby preventing a leakage current between the adjacent sub-pixels.

Meanwhile, a reflective member 338 (e.g., a third electrode) may be formed on the first electrode 332 of the organic light emitting element E. The reflective member 338 may constructively interfere with a light emitted from the organic light emitting layer 334 by a micro cavity (or may resonate a light emitted from the organic light emitting layer 334) to improve a light extraction efficiency of the organic light emitting element E.

That is, a light emitted from the organic light emitting layer 334 is reflected between the second electrode 336 and the reflective member 338, and when a distance between the second electrode 336 and the reflective member 338 is a set distance (i.e., a resonance distance), the light emitted from the organic light emitting layer 334 is output through a constructive interference, thereby improving a light extraction efficiency. That is, the reflective member 338 has a different distance from the second electrode 336 according to a wavelength band of a light emitted from the organic light emitting layer 334, thereby increasing an intensity of light. Thus, a light extraction efficiency of the organic light emitting element E can be improved.

Accordingly, according to various conditions such as a wavelength band of light, the reflective member 338 may be disposed on the first electrode 332 and also below the first electrode 332. Alternatively, the reflective member 338 may be located at inter-layered insulating layer 324 or the gate insulating layer 322. Meanwhile, the reflective member 338 may be formed only in some sub-pixels. For example, the reflective member 338 may be formed only in the R and G sub-pixels, and the reflective member 338 may not be formed in the B sub-pixel.

The reflective member 338 may be formed of a metal having a good reflectance, such as Ag or Al, but is not limited thereto.

In the organic electroluminescent display apparatus 300 according to this aspect, the second electrode 336 may be formed of a single layer or a plurality of layers made of a metal(s) such as Ca, Ba, Mg, Al, Ag, and/or an alloy thereof.

As such, in this embodiment, by forming the trench 311 on the wafer substrate 310 to disconnect some or all of the organic light emitting layer 334, it is possible to prevent color shift due to a lateral leakage current, and further, by forming the reflective member 338 for adjusting an interval that generates a resonance phenomenon in the organic light emitting element E, it is possible to improve a light extraction efficiency.

Although the structure provided with both the trench 311 and the reflective member 338 is disclosed in FIG. 12, a structure provided with the trench 311 or the reflective member 338 is also possible.

Furthermore, in the organic electroluminescent display apparatus 300 of this embodiment, the light control member LCU including the pyramid-shaped or lens-shaped light control pattern 350, the support member 354, and the air layer 352 between the light control patterns 350 on the encapsulation layer 360 of each sub-pixel is formed.

Accordingly, the light control member LCU may control a path of a light emitted from the organic light emitting layer 334 and incident thereon to prevent that a light emitted from a specific sub-pixel (e.g., the R sub-pixel) leaking into an adjacent sub-pixel (e.g., the G sub-pixel). In addition, the light control member LCU may improve a luminance of the organic electroluminescent display apparatus 300 by concentrating a light going to the adjacent sub-pixel to improve an intensity of a light input to the corresponding sub-pixel.

Furthermore, although not shown in the drawings, in the organic electroluminescent display apparatus 300 of this embodiment, a planarization layer may be formed between the support member 354 and the color filter layer 380.

Figure 13:
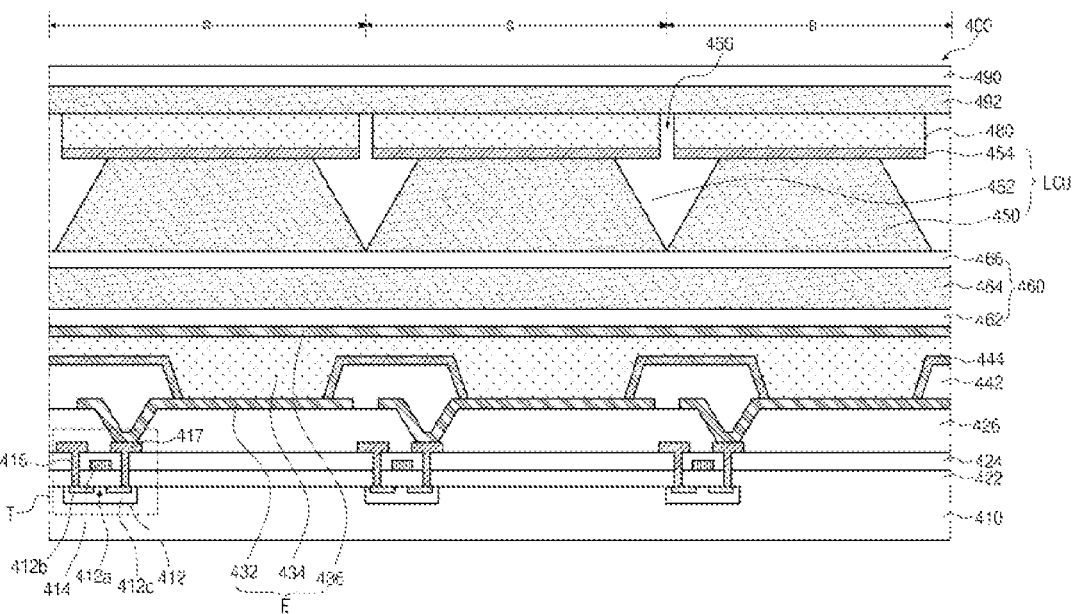
FIG. 13 is a cross-sectional view showing a structure of an organic electroluminescent display apparatus according to aspects of the present disclosure.

FIG. 13 is a cross-sectional view showing a structure of an organic electroluminescent display apparatus 400 according to a fourth embodiment of the present disclosure. The same structures as those of the first embodiment shown in FIG. 5 may be omitted or simplified, and only other structures may be described in detail.

As shown in FIG. 13, in the organic electroluminescent display apparatus 400 of this embodiment, a light control member LCU including a pyramid-shaped or lens-shaped light control pattern 450, a support member 454, and an air layer 452 between the light control patterns 450 on an encapsulation layer 460 of each sub-pixel may be formed. The transistor T may include an active region 412 disposed inside the wafer substrate 410, a gate insulating layer 422 formed on a top surface of the wafer substrate 410, a gate electrode 414 disposed on the gate insulating layer 422, an inter-layered insulating layer 424 formed on the gate insulating layer 422 and the gate electrode 414, and a source electrode 416 and a drain electrode 417 disposed on the inter-layered insulating layer 424. The active region 412 may include a central channel region 412a undoped with impurities, and a source region 412b and a drain region 412c located at both sides of the central channel region 412a and doped with impurities. A bank layer 442 may be formed at a boundary of each sub-pixel on a passivation layer 426. An organic light emitting element E may include a first electrode 432, an organic light emitting layer 434 and a second electrode 436. An encapsulation layer 460 may be formed on the second electrode 436. The encapsulation layer 460 may include a first encapsulation layer 462 made of an inorganic material, a second encapsulation layer 464 made of an organic material, and a third encapsulation layer 466 made of an inorganic material. A protective member 490 may be attached to a color filter layer 480 by an adhesive 492.

Accordingly, the light control member LCU may control a path of a light emitted from an organic light emitting layer 434 and incident thereon, so that it is prevented that a light emitted from a specific sub-pixel (e.g., the R sub-pixel) is input to an adjacent sub-pixel (e.g., the G sub-pixel). In addition, the light control member LCU may improve a luminance of the organic electroluminescent display apparatus 400 by concentrating a light going to the adjacent sub-pixel to improve an intensity of a light input to the corresponding sub-pixel.

In addition, in the organic electroluminescent display apparatus 400 of this embodiment, a reflective layer 444 is formed on a bank layer 442. The reflective layer 444 may be made of a metal such as Al or Ag having a good reflectance and is not limited thereto.

The reflective layer 444 may reflect a light emitted from the organic light emitting layer 434 toward the adjacent sub-pixel and output the light again through a color filter layer 480 of the corresponding sub-pixel. Accordingly, it is possible to more reliably prevent a light from being incident on the adjacent sub-pixel together with the light control member LCU, and thus, it is possible to more reliably prevent defects due to a color mixing with the adjacent sub-pixel. In addition, the reflective layer 444 serves to output the light going to the adjacent sub-pixel together with the light control member LCU to the corresponding sub-pixel again, and thus an intensity of the light input to the corresponding sub-pixel is increased, thereby further increasing a luminance of the organic electroluminescent display apparatus 400.

Since the reflective layer 444 reflects a light emitted from the organic light emitting layer 434 to the adjacent sub-pixel side, the reflective layer 444 may be formed only on a region of the bank layer 442 where the light is incident, that is, formed only on a side surface of the bank layer 442. Alternatively, the reflective layer 444 may be formed on at least a side surface of the bank layer 442.

Alternatively, in the organic electroluminescent display apparatus 400 of this aspect, the reflective layer 444 may be formed as a separate layer on a side surface of the organic light emitting layer 434 instead of the bank layer 442 to reflect a light emitted from the organic light emitting layer 434. In this case, the reflective layer 444 may be formed to have a thickness greater than that of the organic light emitting layer 434.

Meanwhile, in the organic electroluminescent display apparatus 400 of this embodiment, a planarization layer may be formed between the support member 454 and the color filter layer 480, and a trench for disconnection of the organic light emitting layer 434 may be formed on the wafer substrate 410. In addition, a reflective member for a micro cavity may be formed in the organic light emitting element E.

Figure 14:
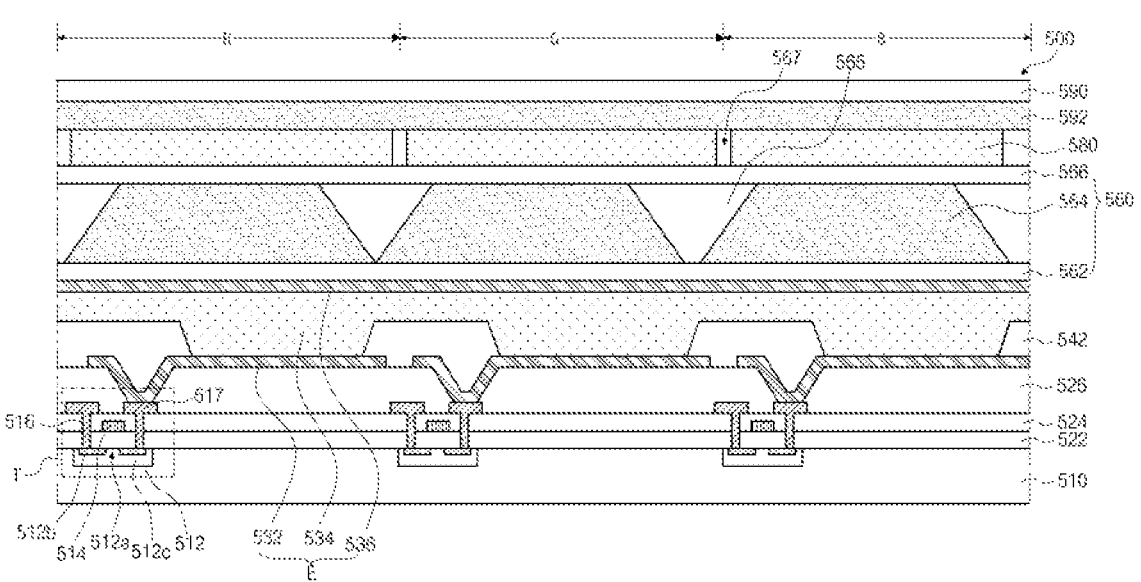
FIG. 14 is a cross-sectional view showing a structure of an organic electroluminescent display apparatus according to aspects of the present disclosure.

FIG. 14 is a cross-sectional view showing a structure of an organic electroluminescent display apparatus according to a fifth embodiment of the present disclosure. The same structures as those of the first embodiment shown in FIG. 5 may be omitted or simplified, and only other structures may be described in detail.

As shown in FIG. 14, in the organic electroluminescent display apparatus 500 of this embodiment, a light control member may be formed in an encapsulation layer 560 of each sub-pixel. The encapsulation layer 560 may include a first encapsulation layer 562 made of an inorganic material, a second encapsulation layer 564 made of an organic material, and a third encapsulation layer 566 made of an inorganic material. The second encapsulation layer 564 may have a pyramid shape or a lens shape, and an air layer 565 may be formed between the adjacent second encapsulation layers 564. Further, a color filter layer 580 may be formed on the third encapsulation layer 566. The transistor T may include an active region 512 disposed inside the wafer substrate 510, a gate insulating layer 522 formed on a top surface of the wafer substrate 510, a gate electrode 514 disposed on the gate insulating layer 522, an inter-layered insulating layer 524 formed on the gate insulating layer 522 and the gate electrode 514, and a source electrode 516 and a drain electrode 517 disposed on the inter-layered insulating layer 524. The active region 512 may include a central channel region 512a undoped with impurities, and a source region 512b and a drain region 512c located at both sides of the central channel region 512a and doped with impurities. A bank layer 542 may be formed at a boundary of each sub-pixel on a passivation layer 526. An organic light emitting element E may include a first electrode 532, an organic light emitting layer 534 and a second electrode 536.

A protective member 590 may be attached to a color filter layer 580 by an adhesive 592.

Accordingly, since a light emitted from the organic light emitting layer 534 is reflected at an interface between the second encapsulation layer 564 and the air layer 565, it is prevented that a light emitted from a specific sub-pixel (e.g., the R sub-pixel) is not input to a corresponding sub-pixel but is input to an adjacent sub-pixel (e.g., the G sub-pixel). In addition, a luminance of the organic electroluminescent display apparatus 500 can be improved by concentrating a light going to the adjacent sub-pixel to improve an intensity of a light input to the corresponding sub-pixel.

As shown in FIG. 14, a color filter layer 580 may be formed with a predetermined interval between adjacent sub-pixels to form an air layer 567 between the R, G, and B color filters. Alternatively, unlike the drawing, the color filter layer 580 may be formed without an air layer between the sub-pixels.

Therefore, due to a difference in refractive index between the color filter layer 580 and the air layer 565, a light propagating to the adjacent sub-pixel in the color filter layer 580 is also reflected and output through the corresponding color filter. Thus, it is possible to more effectively prevent defects due to a color mixing with the adjacent sub-pixel, and further, it is possible to increase a luminance of the corresponding sub-pixel.

Meanwhile, in the organic electroluminescent display apparatus 500 of this embodiment, a planarization layer may be formed between the third encapsulation layer 566 and the color filter layer 580, and a trench for disconnection of the organic light emitting layer 534 may be formed on the wafer substrate 510. In addition, a reflective member for a micro cavity may be formed in the organic light emitting element E. In addition, a reflective layer that reflects a light emitted from the organic emission layer 532 and going to the adjacent sub-pixel back to the corresponding sub-pixel may be formed on at least a portion of a bank layer 542 and/or on a side surface of the organic emission layer 532.

It will be apparent to those skilled in the art that various modifications and variation can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. A display apparatus, comprising:
   a substrate including a plurality of sub-pixels;
   an organic light emitting element formed in each of the plurality of sub-pixels;
   a light control member including a light control pattern disposed in each of the plurality of sub-pixels, and an air layer between adjacent light control patterns;
   a color filter layer disposed on the light control member; and
   a support member provided between the light control pattern and the color filter layer,
   wherein the support member is spaced apart from a support member of an adjacent sub-pixel by a predetermined distance, and is coupled by at least one connecting member.

2. The display apparatus of claim 1, wherein the substrate is formed of a semiconductor wafer.

3. The display apparatus of claim 2, further comprising a transistor formed in each of the plurality of sub-pixels, wherein the transistor includes:
   an active region formed inside the semiconductor wafer;

a gate insulating layer formed on the semiconductor wafer;

a gate electrode formed on the gate insulating layer;

an inter-layered insulating layer formed on the gate electrode; and a source electrode and a drain electrode formed on the inter-layered insulating layer.

4. The display apparatus of claim 1, wherein the light control pattern has a trapezoidal shape or a circumferential shape.

5. The display apparatus of claim 1, wherein the color filter layer includes R, G, and B color filters, and wherein each of the R, G, and B color filters is spaced apart from a color filter of an adjacent sub-pixel by a predetermined distance.

6. The display apparatus of claim 5, wherein another air layer is formed between adjacent color filters.

7. The display apparatus of claim 1, wherein a planarization layer is disposed between the support member and the color filter layer.

8. The display apparatus of claim 1, wherein the organic light emitting element includes:

a first electrode;

an organic light emitting layer on the first electrode; and a second electrode on the organic light emitting layer.

9. The display apparatus of claim 8, wherein the organic light emitting layer emits a white light.

10. The display apparatus of claim 8, further comprising a trench formed in at least a passivation layer and between adjacent sub-pixels to disconnect the organic light emitting layer.

11. The display apparatus of claim 8, further comprising a reflective member formed in the sub-pixel to resonate a light emitted from the organic light emitting layer.

12. The display apparatus of claim 8, further comprising a reflective layer disposed on a side surface of the organic light emitting layer to reflect a light emitted from the organic light emitting layer.

13. The display apparatus of claim 12, wherein a bank layer is formed between the adjacent sub-pixels, and wherein the reflective layer is formed on at least a side surface of the back layer.

14. The display apparatus of claim 1, further comprising an encapsulation layer disposed on the organic light emitting element.

15. The display apparatus of claim 14, wherein the encapsulation layer includes:

a first encapsulation layer made of an inorganic material;

a second encapsulation layer made of an organic material and formed on the first encapsulation layer; and a third encapsulation layer made of an inorganic material and formed on the second encapsulation layer.

16. A display apparatus, comprising:

a substrate including a plurality of sub-pixels;

an organic light emitting element formed in each of the plurality of sub-pixels;

an encapsulation layer disposed on the organic light emitting element; and a color filter layer disposed on the encapsulation layer, wherein the encapsulation layer includes a first encapsulation layer formed entirely over the substrate, a second encapsulation layer formed in a pyramid or lens shape on the first encapsulation layer, and a third encapsulation layer disposed on the second encapsulation layer, wherein an air layer is formed between adjacent second encapsulation layers such that a light emitted from the organic light emitting element is reflected at an interface between the second encapsulation layer and the air layer, wherein the color filter layer includes R, G and B color filters, and wherein another air layer is formed between adjacent color filters of the R, G and B color filters.

17. The display apparatus of claim 4, wherein a light incident to a boundary of the light control pattern is reflected based on a difference in a refractive index between the light control pattern and an adjacent material.

18. The display apparatus of claim 1, wherein a portion of a bottom surface of the support member overhangs a top surface of the light control pattern.

* * * * *